(12) United States Patent
Morino

(10) Patent No.: US 9,581,634 B2
(45) Date of Patent: *Feb. 28, 2017

(54) POWER SUPPLY CURRENT MONITORING DEVICE

(71) Applicant: DENSO CORPORATION, Kariya, Aichi-pref. (JP)

(72) Inventor: Seiji Morino, Nagoya (JP)

(73) Assignee: DENSO CORPORATION, Kariya (JP)

( * ) Notice: Subject to any disclaimer, the term of this patent is extended or adjusted under 35 U.S.C. 154(b) by 258 days.

This patent is subject to a terminal disclaimer.

(21) Appl. No.: 14/515,873

(22) Filed: Oct. 16, 2014

(65) Prior Publication Data

US 2015/0109020 A1  Apr. 23, 2015

(30) Foreign Application Priority Data

Oct. 22, 2013  (JP) ................................. 2013-219111

(51) Int. Cl.
*G06F 11/30*  (2006.01)
*G07C 5/00*  (2006.01)
(Continued)

(52) U.S. Cl.
CPC ....... *G01R 31/025* (2013.01); *G01R 19/0092* (2013.01); *G01R 19/16538* (2013.01);
(Continued)

(58) Field of Classification Search
CPC .............. G01R 31/025; G01R 19/0092; G01R 19/16538; G01R 31/006; G01R 31/42; G01R 31/343
(Continued)

(56) References Cited

U.S. PATENT DOCUMENTS

2005/0088126 A1  4/2005  Kawashima et al.
2011/0035108 A1*  2/2011  Yamashita ........... B62D 5/0463
701/41
(Continued)

FOREIGN PATENT DOCUMENTS

JP  08-282523  10/1996
JP  2003-219675  7/2003
(Continued)

OTHER PUBLICATIONS

Morino, Final Office Action (11 pages) dated Feb. 22, 2016, issued in copending U.S. Appl. No. 14/516,109, filed Oct. 16, 2014.
(Continued)

*Primary Examiner* — Calvin Cheung
*Assistant Examiner* — Paula L Schneider
(74) *Attorney, Agent, or Firm* — Nixon & Vanderhye P.C.

(57) ABSTRACT

A power supply current monitoring apparatus is used for a load drive apparatus with two systems to drive a load. Each system includes a drive circuit connected in parallel with a battery and a relay connected between the drive circuit and a point at which power of the battery is divided between the systems. When overcurrent is detected once in one system, a repetitive monitoring process is performed. The monitoring process determines whether the overcurrent occurs by repeating a monitoring cycle. The monitoring cycle turns OFF the relay of one system and then monitors currents by turning ON the relay of one system when a predetermined cycle time elapses since the overcurrent detection. The monitoring process includes a mask procedure to stop monitoring the current in the other system. The mask procedure is performed after the relay of one system is turned OFF in each monitoring cycle.

5 Claims, 11 Drawing Sheets

(51) Int. Cl.
- *G01M 17/00* (2006.01)
- *G06F 7/00* (2006.01)
- *G06F 19/00* (2011.01)
- *G01R 31/02* (2006.01)
- *G01R 19/00* (2006.01)
- *G01R 19/165* (2006.01)
- *G01R 31/00* (2006.01)
- *G01R 31/42* (2006.01)
- *G01R 31/34* (2006.01)

(52) U.S. Cl.
CPC .......... *G01R 31/006* (2013.01); *G01R 31/42* (2013.01); *G01R 31/343* (2013.01)

(58) Field of Classification Search
USPC ........................................................ 701/34.4
See application file for complete search history.

(56) References Cited

U.S. PATENT DOCUMENTS

2011/0127936 A1* 6/2011 Ogasawara ........... H02M 3/158
318/400.3
2013/0220726 A1 8/2013 Satou et al.

FOREIGN PATENT DOCUMENTS

| JP | 2005-075310 | 3/2005 |
| JP | 2008-206276 | 9/2008 |
| JP | 2009-067174 | 4/2009 |
| JP | 2013-038950 | 2/2013 |

OTHER PUBLICATIONS

Office Action (8 pages) dated Oct. 20, 2015, issued in copending U.S. Appl. No. 14/516,109, filed Oct. 16, 2014 to Morino.

U.S. Appl. No. 14/516,109, filed Oct. 16, 2014, Power Supply Current Monitoring Device.

U.S. Appl. No. 14/515,873, filed Oct. 16, 2014, Power Supply Current Monitoring Device.

Morino, U.S. Appl. No. 14/516,109, filed Oct. 16, 2014.

* cited by examiner

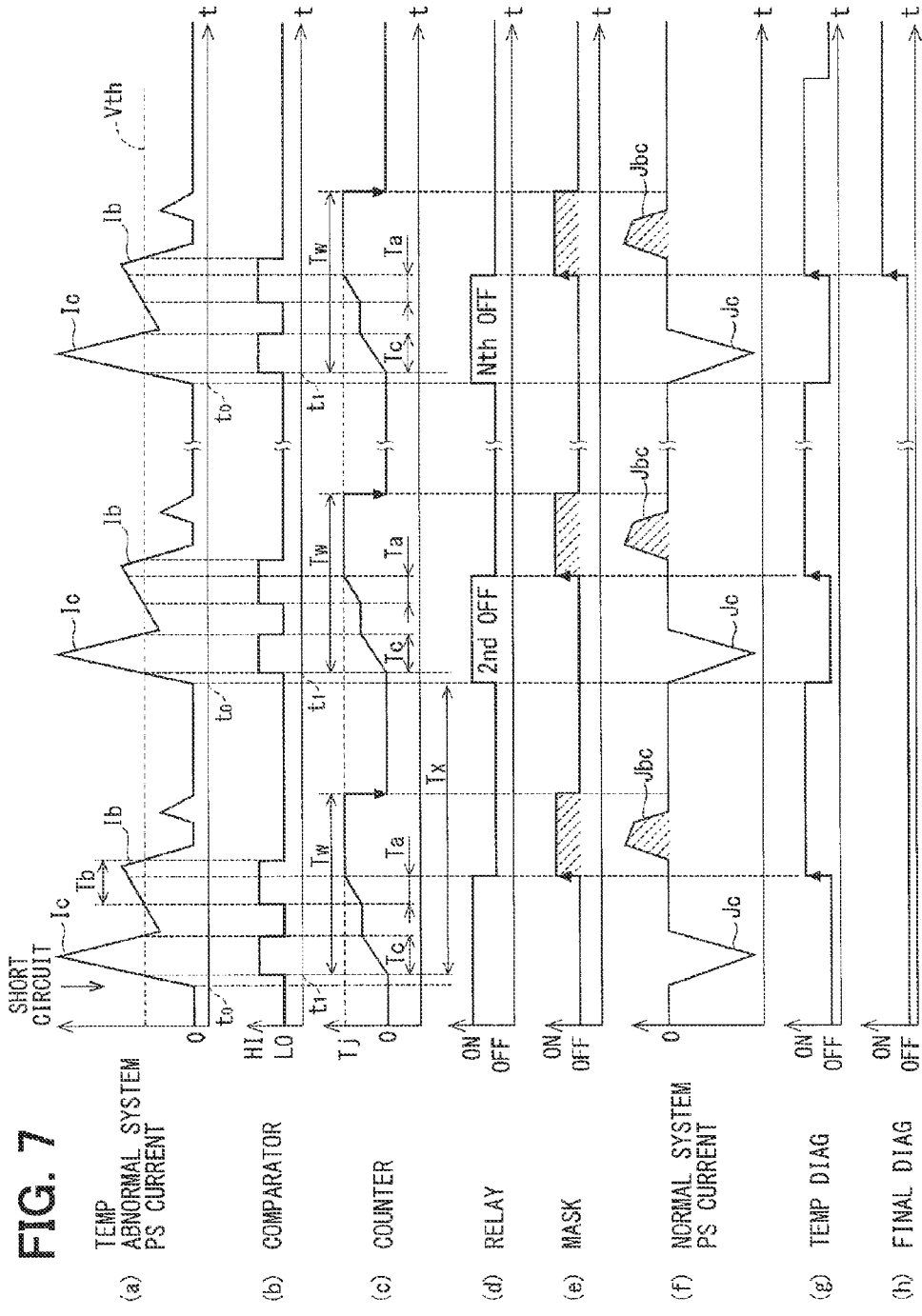

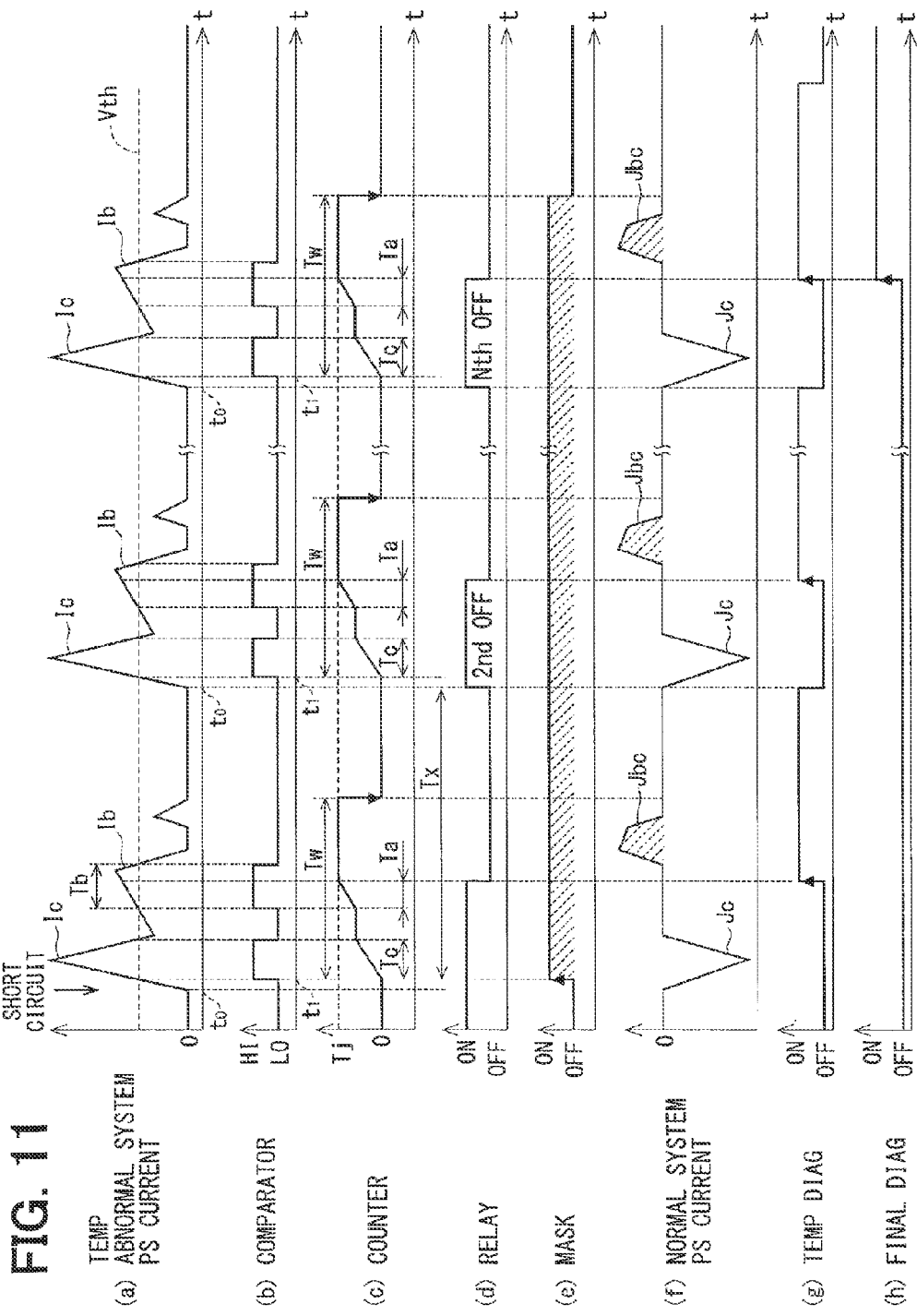

POWER SUPPLY CURRENT MONITORING DEVICE

CROSS REFERENCE TO RELATED APPLICATION

This application is based on and claims priority to Japanese Patent Application No. 2013-219111 filed on Oct. 22, 2013, the contents of which are incorporated herein by reference.

FIELD

The present disclosure relates to a power supply current monitoring device for monitoring a magnitude of a power supply current in a drive circuit which drives an electric load.

BACKGROUND

In a technique disclosed in JP-A-2003-219675, a power supply current sensor is provided in a power supply path from a battery (i.e., a power supply) to a drive circuit which drives an electric load such as a motor. When a short-circuit failure occurs in the drive circuit, the power supply current sensor detects an overcurrent condition, and a power supply relay is turned OFF so that the power supply path can be interrupted.

When a power supply current sensor is used to detect an overcurrent condition, a detection error may be caused, for example, by noise or a short circuit due to a momentary circuit contact. To eliminate such a detection error, a repetitive monitoring process may be performed. In the repetitive monitoring process, a power supply relay is repeatedly turned ON and OFF after an overcurrent condition is detected once, and then when the overcurrent condition is detected a predetermined consecutive number of times, it is finally determined that a short-circuit failure occurs. For a drive circuit with one system having an inverter, this repetitive monitoring process is effective at eliminating the detection error, thereby preventing an unnecessary fail-safe operation from stopping functions.

For example, in an electric power steering system for a vehicle, multiple systems, each of which has a motor drive circuit, are configured in a redundant manner to increase reliability. In general, an input stage of a drive circuit such as an inverter is provided with a capacitor to smooth an input voltage. In an apparatus where a drive circuit of each of multiple systems is connected in parallel to a power supply, a capacitor of an input stage of each drive circuit remains charged during normal operation.

Here it is assumed that a power supply relay is turned OFF when an overcurrent condition in a drive circuit of one of two systems is detected once. The system where the overcurrent condition is detected once is sometimes hereinafter referred to as the "temporary abnormal system", while the other system is sometimes hereinafter referred to as the "normal system". If the drive circuit of the temporary abnormal system is actually short-circuited, the capacitor of the input stage of the temporary abnormal system is discharged. For this reason, when the power supply relay is turned ON again in the repetitive monitoring process, charges stored in the capacitor of the input stage of the normal system flows as an inrush current into the temporary abnormal system. Therefore, even when the short-circuit failure is cured so that the temporary abnormal system returns to normal, the repetitive monitoring process incorrectly determines that the temporary abnormal system remains in an overcurrent condition due to the inrush current. That is, the inrush current is incorrectly detected as an excessive power supply current.

Further, in the normal system, when the power supply relay is turned OFF upon the incorrect determination that the temporary abnormal system remains in an overcurrent condition, a secondary inrush current flows from the power supply to the capacitor of the input stage. Due to this secondary inrush current, it may be incorrectly determined that the normal system is in an overcurrent condition. Therefore, in an apparatus with multiple systems, each of which has a drive circuit, it is difficult to finally determine that the temporary abnormal system is in an overcurrent condition by the repetitive monitoring process.

SUMMARY

In view of the above, it is an object of the present disclosure to provide a power supply current monitoring device capable of finally determining that a temporary abnormal system is in an overcurrent condition by performing a repetitive monitoring process while preventing a detection error caused by an inrush current flowing from a normal system into the temporary abnormal system.

According to an aspect of the present disclosure, a power supply current monitoring device is used for a load drive apparatus which includes a battery and two systems configured to work in cooperation with each other to drive a load. Each system includes a drive circuit, an input capacitor, and a power supply relay. The drive circuit is connected in parallel with the battery. The input capacitor is connected between the battery and the drive circuit. The power supply relay is connected between the drive circuit and a power blanching point, at which power of the battery is divided between the systems, to open and close a power supply path from the battery to the drive circuit. The power supply current monitoring device monitors a magnitude of a power supply current flowing through the power supply relay toward the drive circuit in each system. It is noted that the power supply current includes not only a current supplied from the battery to the drive circuit but also a current flowing from one system into the other system via the power blanching point.

The power supply current monitoring device includes a failure determinator and a power supply relay controller. The failure determinator determines whether a short-circuit failure occurs based on a voltage across a current detector through which the power supply currents flows. The short-circuit failure is defined as a failure occurring when a high potential side and a low potential side of the drive circuit is short-circuited. The power supply relay controller opens and closes the power supply relay.

When the failure determinator detects the power supply current exceeding a predetermined first threshold once in one of the systems, a repetitive monitoring process is performed. The one of the systems is defined as a temporary abnormal system having a possibility that the short-circuit failure occurs therein, and the other of the systems is defined as a normal system having no possibility that the short-circuit failure occurs therein. The repetitive monitoring process determines that the short-circuit failure actually occurs in the temporary abnormal system when a predetermined condition is satisfied by repeating a monitoring cycle a predetermined number of times. In the monitoring cycle, the power supply relay of the temporary abnormal system is turned OFF, and then the magnitude of the power supply current is monitored when a predetermined cycle time elapses from a start time by turning ON the power supply relay of the temporary abnormal system. The start time is a time at which the power supply current exceeds the first threshold.

The power supply current to be monitored in the monitoring cycle when the power supply relay of the temporary abnormal system is turned ON contains a capacitor inrush current and a battery short-circuit current. The capacitor inrush current is a current flowing from the input capacitor of the normal system into the temporary abnormal system. The battery short-circuit current is a current flowing from the battery into the temporary abnormal system when the short-circuit failure continues in the temporary abnormal system.

The repetitive monitoring process includes a mask procedure to stop monitoring the magnitude of the power supply current in the normal system. The mask procedure is performed at least for a predetermined time period after the power supply relay of the temporary abnormal system is turned OFF in each the monitoring cycle.

For example, the monitoring cycle can accumulate an overcurrent time during which the power supply current remains above the first threshold after the power supply relay is turned ON. In this case, when the overcurrent time reaches a predetermined second threshold, the power supply relay is turned OFF and simultaneously the mask procedure is started. Then, the mask procedure is finished when a predetermined monitoring time elapses from the start time. The monitoring time is smaller than the cycle time.

In the repetitive monitoring process, when the power supply relay of the temporary abnormal system is turned OFF, a capacitor inrush current is discharged from the input capacitor of the normal system. Then, when the power supply relay of the temporary abnormal system is turned OFF upon detection that the power supply current in the temporary abnormal system is excessive, a secondary inrush current flows from the battery into the input capacitor of the normal system. Due to this secondary inrush current, the power supply current in the normal system may be incorrectly detected as excessive. To prevent such a detection error, the mask procedure is performed to stop monitoring the power supply current in the normal system at least for a predetermined time period after the power supply relay of the temporary abnormal system is turned OFF in each the monitoring cycle.

BRIEF DESCRIPTION OF THE DRAWINGS

The above and other objects, features and advantages of the present disclosure will become more apparent from the following detailed description made with reference to the accompanying drawings. In the drawings:

FIG. 7 is a timing diagram of a repetitive monitoring process according to the first embodiment observed when a short-circuit failure occurred in one system continues;

FIG. 11 is a timing diagram of a repetitive monitoring process according to a second embodiment of the present disclosure observed when a short-circuit failure occurred in one system continues.

DETAILED DESCRIPTION

Embodiments of the present disclosure are described below with reference to the drawings. In the embodiments, a power supply current monitoring device according to the present disclosure is used in a motor drive apparatus for an electric power steering system for a vehicle.

First Embodiment

A motor drive apparatus 10 according to a first embodiment of the present disclose is described below with reference to FIGS. 1-10. Firstly, an overall structure of the motor drive apparatus 10 is described with reference to FIG. 1.

(System Structure)

Figure 1:
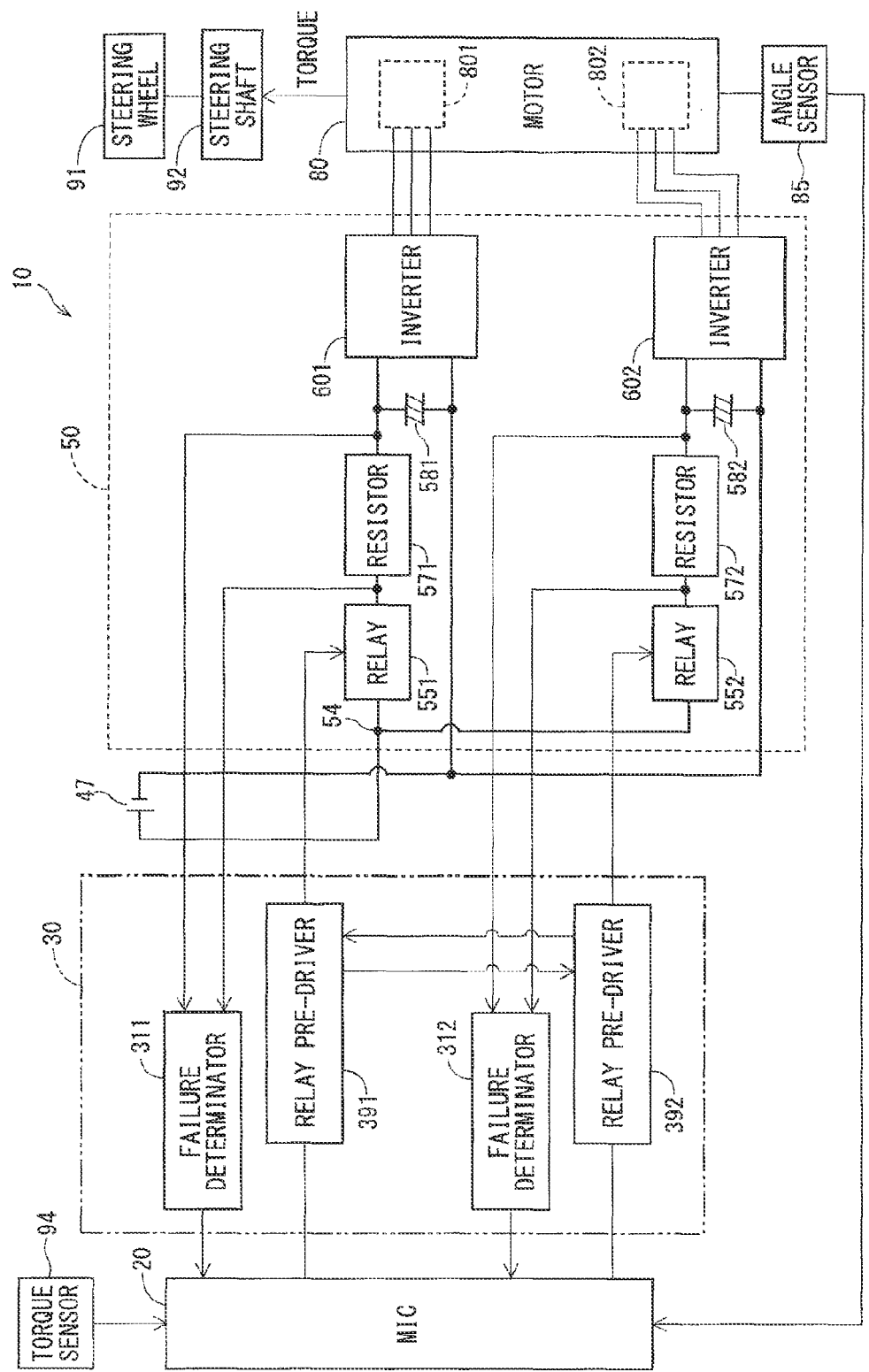
FIG. 1 is a block diagram of a motor drive apparatus including a power supply current monitoring device according to a first embodiment of the present disclosure.

As shown in FIG. 1, the motor drive apparatus 10 includes a microcomputer 20, a power supply current monitoring device 30, a battery 47, and a power converter 50. The power converter 50 has a first-system inverter 601 and a second-system inverter 602 to provide a redundant configuration. Each of the first-system inverter 601 and the second-system inverter 602 corresponds to a drive circuit recited in claims. The motor drive apparatus 10 drives a motor 80 as an electric load. The motor drive apparatus 10 corresponds to a load drive apparatus recited in claims. The motor drive apparatus 10 is used, in particular, for an electric power steering system that helps a driver steer a vehicle by augmenting steering effort of a steering wheel 91.

The motor drive apparatus 10 controls and drives the motor 80 based on signals including a steering torque signal and a rotation angle signal. The steering torque signal is inputted to the microcomputer 20 from a torque sensor 94. The rotation angle signal is inputted to the microcomputer 20 from a rotation angle sensor 85. Accordingly, the motor 80 outputs steering assist torque that augments the driver's steering effort of the steering wheel 91. The steering assist torque is transmitted to a steering shaft 92 through a reduction gear (not shown).

For example, the motor 80 is a three-phase brushless AC motor and includes two three-phase winding sets: a first-system winding set 801 and a second-system winding set 802. The power converter 50 has the first-system inverter 601 for the first-system winding set 801 and the second-system inverter 602 for the second-system winding set 802. The motor 80 is driven by electric power outputted by the inverters 601 and 602. Even when one of the inverters 601 and 602 breaks down, the other of the inverters 601 and 602 can continue to drive the motor 80. In this way, each of the power converter 50 and the motor 80 has first and second systems configured in a redundant manner to improve reliability of the motor drive apparatus 10.

In the description below, basically, components for the first system are given three-digit numbers ending in "1" and components for the second system are given three-digit numbers ending in "2" so that the first-system components and be distinguished from the second-system components.

The battery 47 is an electrical energy storage device capable of storing and supplying DC power. Examples of the battery 47 can include an electric double-layer capacitor, a secondary cell such as a lithium-ion secondary cell, etc. The DC power of the battery 47 is divided between the first system and the second system at a power branching point 54 on the positive side of the battery 47.

In the power converter 50, an input side of the inverter 601 is provided with a power supply relay 551, a shunt resistor 571, and an input capacitor 581, and an input side of the inverter 602 is provided with a power supply relay 552, a shunt resistor 572, and an input capacitor 582. The power supply relay 551, the shunt resistor 571, and the input capacitor 581 are identical in specification and electric performance with the power supply relay 552, the shunt resistor 572, and the input capacitor 582, respectively.

The power supply relay 551 is connected between the power branching point 54 and the inverter 601 to connect and disconnect the inverter 601 to and from a power supply path. The power supply relay 552 is connected between the power branching point 54 and the inverter 602 to connect and disconnect the inverter 602 to and from the power supply path.

The shunt resistor 571 is connected in series with the power supply relay 551, and the power supply current monitoring device 30 measures a power supply current flowing through the power supply relay 551 based on a voltage across the shunt resistor 571. The shunt resistor 572 is connected in series with the power supply relay 552, and the power supply current monitoring device 30 measures the power supply current flowing through the power supply relay 552 based on a voltage across the shunt resistor 572. The power supply current has a positive value when flowing in a direction from the battery 47 toward the inverters 601 and 602. As described later, the power supply current monitoring device 30 monitors the magnitude of the power supply current having the positive value for each system. The shunt resistors 571 and 572 correspond to current detectors recited in claims.

The input capacitor 581 is connected between a high potential side and a low potential side of the inverter 601 to store charges, to assist power supply to the inverter 601, and to smooth a ripple. The input capacitor 582 is connected between a high potential side and a low potential side of the inverter 602 to store charges, to assist power supply to the inverter 602, and to smooth a ripple.

The inverters 601 and 602 convert DC power of the battery 47 to three-phase AC power and supply the AC power to the winding sets 801 and 802, respectively.

The microcomputer 20 calculates control values, related to controlling and driving of the motor 80, based on the input signals including the steering torque signal and the rotation angle signal.

The power supply current monitoring device 30 performs a repetitive monitoring process as described later and includes a failure determinator 311 and a power supply relay pre-driver 391 for the first system and a failure determinator 312 and a power supply relay pre-driver 392 for the second system. Each of the failure determinators 311 and 312 corresponds to a failure determinator recited in claims. Each of the power supply relay pre-drivers 391 and 392 corresponds to a power supply relay controller recited in claims.

The failure determinator 311 detects the power supply current based on the voltage across the shunt resistor 571 and determines whether the first system suffers from a short-circuit failure that occurs when the high potential side and the low potential side of the inverter 601 are short-circuited. The failure determinator 312 detects the power supply current based on the voltage across the shunt resistor 572 and determines whether the second system suffers from a short-circuit failure that occurs when the high potential side and the low potential side of the inverter 602 are short-circuited. The high potential side of each of the inverters 601 and 602 is connected to a positive terminal of the battery 47, and the low potential side of each of the inverters 601 and 602 is connected to a negative terminal of the battery 47. As described above, according to the first embodiment, the "short-circuit failure" is defined as a failure occurring when the high potential side and the low potential side of the drive circuit are short-circuited and does not mean a failure occurring, for example, when phases of the three-phase winding set are short-circuited.

The power supply relay pre-driver 391 closes and opens the power supply relay 551 based on commands from the failure determinator 311 and the microcomputer 20. The power supply relay pre-driver 392 closes and opens the power supply relay 552 based on commands from the failure determinator 312 and the microcomputer 20. Further, the power supply relay pre-drivers 391 and 391 exchange signals related to a mask procedure each other. The mask procedure is described later.

Figure 2:
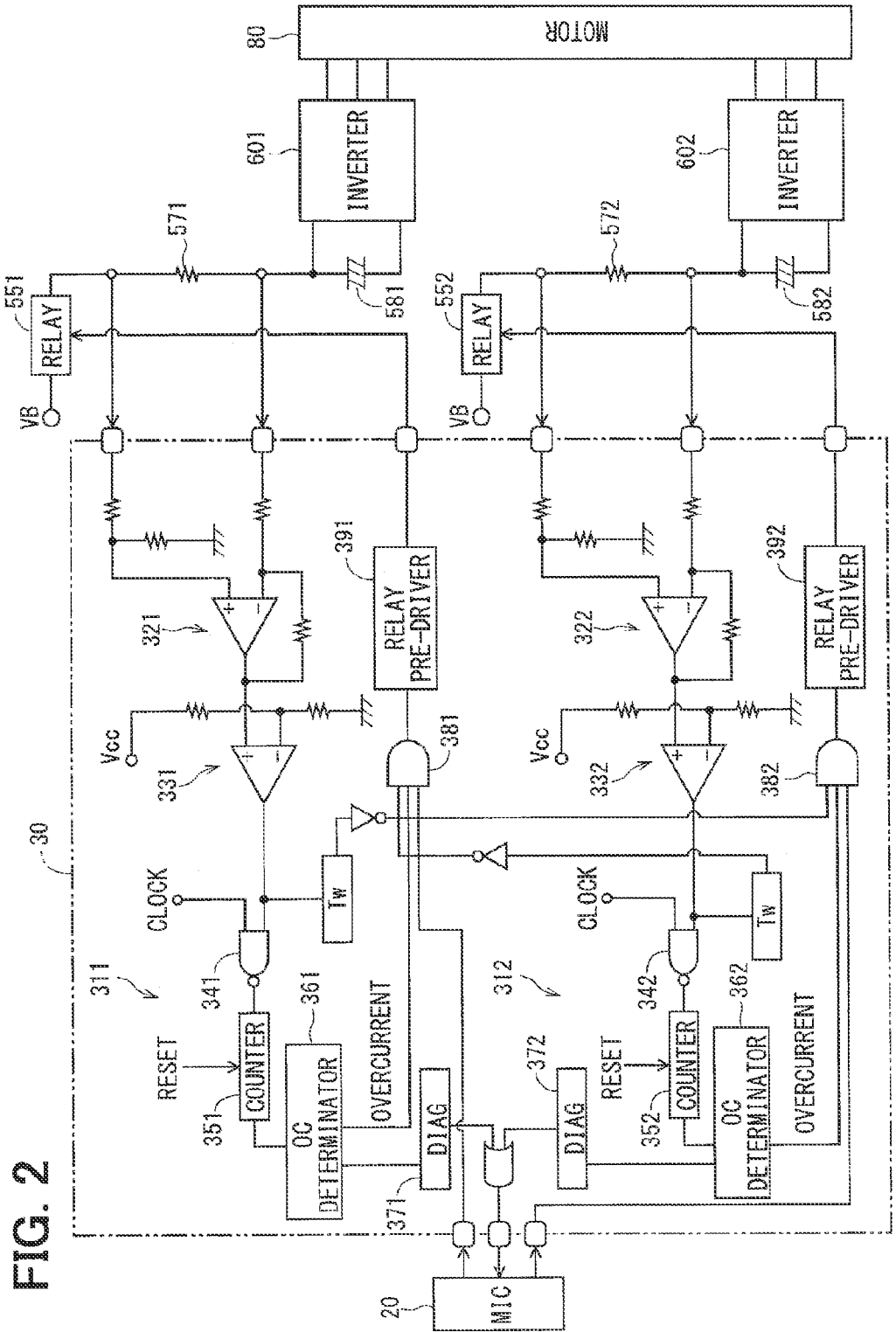
FIG. 2 is a schematic diagram of the power supply current monitoring device.

Next, a detailed structure of the power supply current monitoring device 30 is described with reference to FIG. 2. Like the power converter 50, the power supply current monitoring device 30 has first and second systems configured in a redundant manner to improve reliability of the motor drive apparatus 10. Since the first system and the second system of the power supply current monitoring device 30 are structured in the same manner, a structure of the first system is described as an example.

As described above, the power supply current monitoring device 30 includes the failure determinator 311 and the power supply relay pre-driver 391. The failure determinator 311 determines whether the short-circuit failure occurs in the inverter 601. The power supply relay pre-driver 391 opens and closes the power supply relay 551.

The failure determinator 311 includes a voltage amplifier 321, a comparator 331, an NAND gate 341, an accumulated time counter 351, an overcurrent determinator 361, and a diagnosis signal generator 371.

The voltage across the shunt resistor 571 as a detection voltage is amplified by the voltage amplifier 321 and then inputted to the comparator 331. The comparator 331 compares the amplified detection voltage with a predetermined reference voltage. When the detection voltage is less than the reference voltage, the comparator 331 outputs a low signal, and when the detection voltage is not less than the reference voltage, the comparator 331 outputs a high signal.

The NAND gate 341 performs a logical NAND operation between the output signal of the comparator 331 and a clock signal and outputs a signal indicative of the result of the NAND operation to the accumulated time counter 351.

The overcurrent determinator 361 determines whether an accumulated time counted by the accumulated time counter 351 reaches a predetermined threshold time. When determining that the accumulated time reaches the threshold time, the overcurrent determinator 361 outputs an overcurrent detection signal.

The diagnosis signal generator 371 generates a diagnosis signal based on a result of the determination by the overcurrent determinator 361 and outputs the diagnosis signal to the microcomputer 20.

To close and open the power supply relay 551, an AND gate 381 of the first system performs a logical AND operation on three inputs: the command from the microcomputer 20, the overcurrent detection signal from the overcurrent determinator 361, and a signal indicating that the second system is outside a predetermined monitoring time Tw, which is described later. Likewise, to close and open the power supply relay 552, an AND gate 382 of the second system performs a logical AND operation on three inputs: the command from the microcomputer 20, the overcurrent detection signal from an overcurrent determinator 362, and a signal indicating that the first system is outside the monitoring time Tw. In this way, the power supply current monitoring device 30 performs the mask procedure for one of the first and second systems based on whether the other of the first and second systems is within the monitoring time Tw.

The power supply relay pre-driver 391 transmits a switching signal to a gate of the power supply relay 551 based on an output signal of the AND gate 381, and the power supply relay pre-driver 392 transmits a switching signal to a gate of the power supply relay 552 based on an output signal of the AND gate 382.

Next, a detailed structure of the power converter 50 and a current flowing in the power converter 50 when the short-circuit failure occurs in any of the first system and the second system are described with reference to FIG. 3 and FIGS. 4A to 4C.

Figure 3:
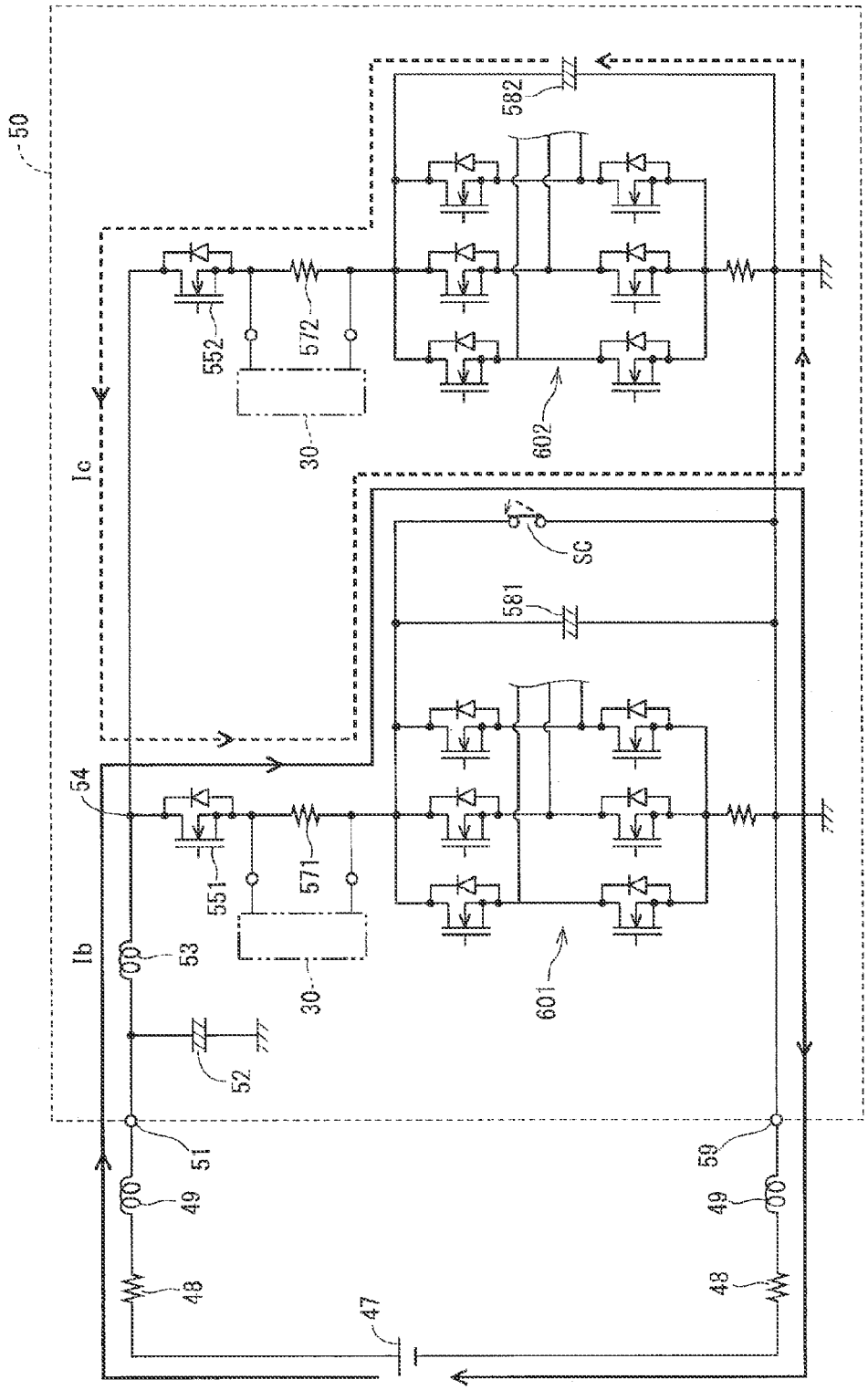
FIG. 3 is a diagram for explaining a current flowing when a short-circuit failure occurs in one system.

As shown in FIG. 3, the power converter 50 has a positive terminal connection point 51 connected to a positive wire extending from the positive terminal of the battery 47 and a negative terminal connection point 59 connected to a negative wire extending from the negative terminal of the battery 47. Each of the positive and negative wires has a wire resistance 48 and a wire inductance 49.

The power converter 50 has a capacitor 52 and a coil 53 on an input side leading to the positive terminal connection point 51. The capacitor 52 and the coil 53 form a noise filter. The power branching point 54, at which the DC power of the battery 47 is divided between the first system and the second system, is provided by a terminal of the coil 53 on a far side from the battery 47. The first system, shown on a left side of FIG. 3, includes the power supply relay 551, the shunt resistor 571, the input capacitor 581, and the inverter 601. The second system, shown on a right side of FIG. 3, includes the power supply relay 552, the shunt resistor 572, the input capacitor 582, and the inverter 602.

According to the first embodiment, each of the power supply relays 551 and 552 has a switching element, and each of the inverters 601 and 602 has six switching elements connected in a bridge configuration. The switching elements of the inverter 601 are turned ON and OFF in accordance with the switching signals inputted to their gates from the power supply relay pre-driver 391 so that each phase of the three-phase winding set 801 can be energized in turn. The switching elements of the inverter 602 are turned ON and OFF in accordance with the switching signals inputted to their gates from the power supply relay pre-driver 392 so that each phase of the three-phase winding set 802 can be energized in turn. For example, these switching elements can be metal-oxide semiconductor field-effect transistors (MOSFETs). Since a structure of a three-phase inverter is well known, detailed explanation of the structures of the inverters 601 and 602 are omitted.

Here it is assumed that the short-circuit failure occurs in the power converter 50 due to the fact that the high potential side and the low potential side of the inverter 601 of the first system are short-circuited. FIG. 3 shows the short-circuit failure schematically using an imaginary switch SC. It can be considered that a situation where the imaginary switch SC is ON is equivalent to a situation where the short-circuit failure occurs.

In the following description based on the situation shown in FIG. 3, the first system, where the short-circuit failure occurs, is sometimes referred to as the "abnormal system", and the second system is sometimes referred to as the "normal system".

When the short-circuit failure occurs in the first-system inverter 601, a battery short-circuit current Ib from the battery 47 flows through the first-system power supply relay 551 as indicated by a solid arrow. Further, charges stored in the second-system input capacitor 582 flows as a capacitor inrush current Ic through the first-system power supply relay 551 as indicated by a broken arrow. Accordingly, the battery short-circuit current Ib and the capacitor inrush current Ic are collectively detected as the "power supply current" of the first system.

As described above, in the power converter 50 where the inverters 601 and 602 of the two systems are connected in parallel with the battery 47, when the short-circuit failure occurs in one system, the capacitor inrush current Ic flows from the normal system into the abnormal system by way of the power branching point 54. This phenomenon is unique to a structure with multiple-system inverters and cannot be expected in a structure with a single-system inverter.

In general, when a power supply current sensor is used to detect an excessive power supply current, a detection error may be caused, for example, by noise or a short circuit due to a momentary circuit contact. To eliminate such a detection error, a repetitive monitoring process may be performed. In the repetitive monitoring process, a power supply relay is repeatedly turned ON and OFF after the excessive power supply current is detected once, and when the excessive power supply current is detected a predetermined consecutive number of times, it is determined that a short-circuit failure occurs. For a drive circuit with a single-system inverter, this repetitive monitoring process is effective at eliminating the detection error, thereby preventing an unnecessary fail-safe operation from stopping functions.

However, in an apparatus with two systems, each of which has a drive circuit, it is difficult to adequately perform the repetitive monitoring process because of the above-described capacitor inrush current Ic. To explain a reason for this, changes in the capacitor inrush current Ic and the battery short-circuit current Ib over time in the repetitive monitoring process are described with reference to FIGS. 4A-4C. In the repetitive monitoring process, a system where an excessive power supply current is detected once is regarded as the "temporary abnormal system", and the power supply current is monitored by repeatedly turning ON and OFF a power supply relay. Thus, the repetitive monitoring process determines whether the excessive power supply current is detected due to a short-circuit failure actually occurring in an inverter of the temporary abnormal system or due to other factors such as noise, a momentary contact, etc.

Figure 4A:
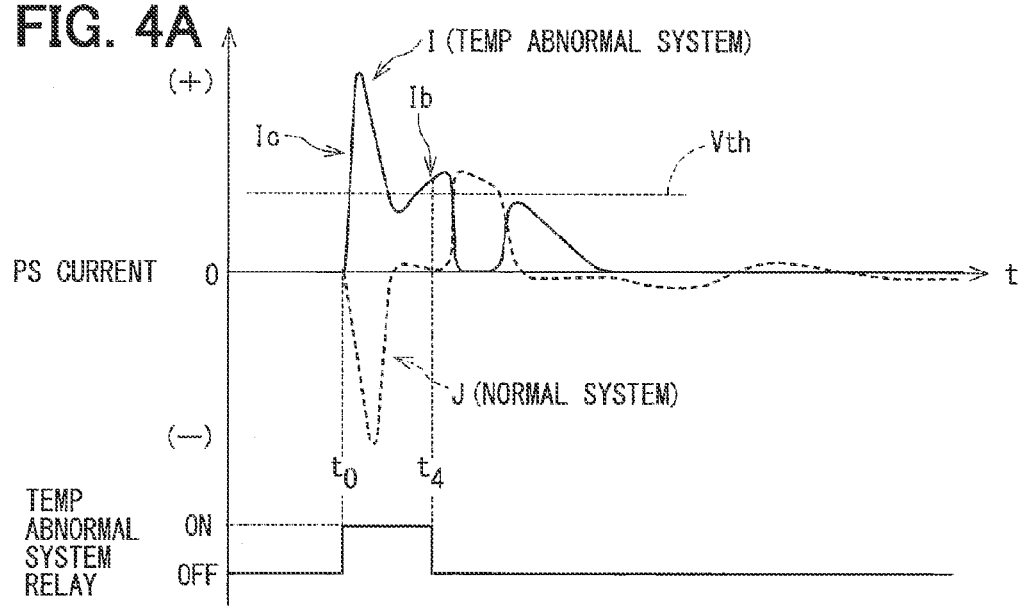
FIGS. 4A-4C show waveforms of a power supply current flowing through a power supply relay of a temporary abnormal system.
Figure 4B:
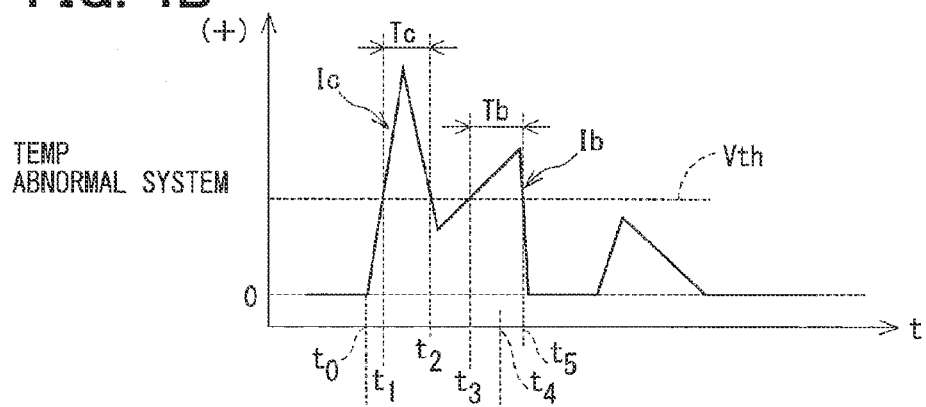
Figure 4C:
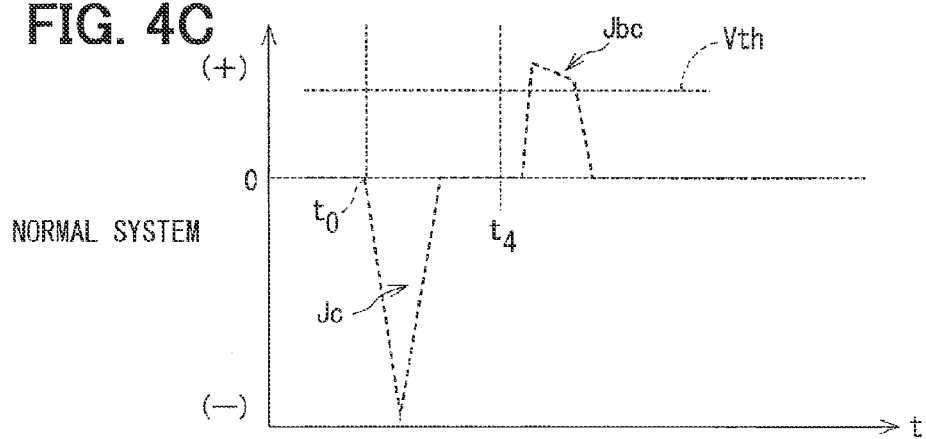

FIG. 4A shows a waveform of a power supply current obtained in an experiment conducted by the present inventor. FIG. 4B shows a power supply current I of the temporary abnormal system schematically. FIG. 4C shows a power supply current J of the normal system schematically. FIGS. 4A-4C are based on a situation where the short-circuit failure actually occurs in the temporary abnormal system.

In the temporary abnormal system, when the power supply relay 551 is turned ON at the time t0, so that a short-circuit condition occurs, a peak of the capacitor inrush current appears firstly, and subsequently a peak of the battery short-circuit current appears. Then, when the power supply current exceeds a predetermined threshold Vth, it is detected that the power supply current is excessive.

As described previously, in the power supply current monitoring device 30, the voltage across each of the shunt resistors 571 and 572 as the detection voltage is amplified and then compared with the reference voltage. That is, in fact, the power supply current is not directly compared with a current threshold. However, it is a common knowledge that a voltage and a current can be converted to each other. Therefore, in the first embodiment, the expression "when the power supply current exceeds the threshold Vth" is used.

As shown in FIG. 4B, in the temporary abnormal system, the capacitor inrush current Ic remains above the threshold Vth during a time period from the time t1 to a time t2, and the battery short-circuit current Ib remains above the threshold Vth during a time period from a time t3 to a time t5. The time period during which the power supply current remains above the threshold Vth is hereinafter referred to as the "overcurrent time". Specifically, the time period from the time t1 to the time t2, during which the capacitor inrush current Ic remains above the threshold Vth, is hereinafter referred to as the "first overcurrent time Tc", and the time period from the time t3 to the time t5, during which the battery short-circuit current Ib remains above the threshold Vth, is hereinafter referred to as the "second overcurrent time Tb". Further, the time t1 at which the power supply current exceeds the threshold Vth for the first time is hereinafter referred to as the "start time t1". The accumulated time is counted from the start time t1.

In the temporary abnormal system, the power supply relay 551 is turned OFF at a time t4 between the time t3 and the time t5 as a fail-safe operation.

In contrast, as shown in FIG. 4C, in the normal system, a capacitor discharge current Jc having a negative value occurs at a time t0 as a reverse of the capacitor inrush current Ic. Further, when the power supply relay 551 of the temporary abnormal system is turned OFF at the time t4 as described above, a terminal voltage of the power branching point 54 increases by energy stored in the wire inductance 49 and the coil 53. Accordingly, a current Jbc having a positive value flows from the battery 47 into the input capacitor 582. The current Jbc is hereinafter referred to as the "secondary inrush current".

Next, a rationale for the capacitor inrush current Ic is described with reference to FIGS. 5A and 5B, and a rationale for the battery short-circuit current Ib is described with reference to FIGS. 6A and 6B.

Figure 5A:
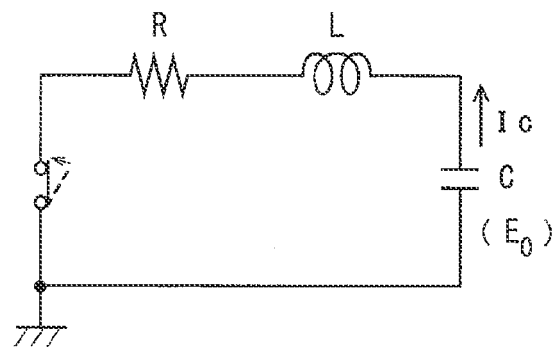
FIG. 5A is a schematic diagram of a circuit model used to obtain a theoretical waveform of a capacitor inrush current.

As shown in FIG. 5A, in a circuit assumed here, a resistor having a resistance R and a coil having an inductance L are connected in series with a capacitor having a capacitance C and charged to a DC voltage E0. When the circuit changes from an open state to a closed change by closing a switch as indicated by an arrow in FIG. 5A, a capacitor inrush current Ic(t) given by the following formulas (1.1), (1.2), and (1.3) is discharged from the capacitor:

$$Ic(t) = \frac{E_0}{L \cdot \omega_f} \cdot e^{-\frac{t}{\tau}} \sin\omega_f t \tag{1.1}$$

$$\omega_f = \sqrt{\frac{1}{LC} - \left(\frac{R}{2L}\right)^2} \tag{1.2}$$

$$\tau = \frac{2L}{R} \tag{1.3}$$

Figure 5B:
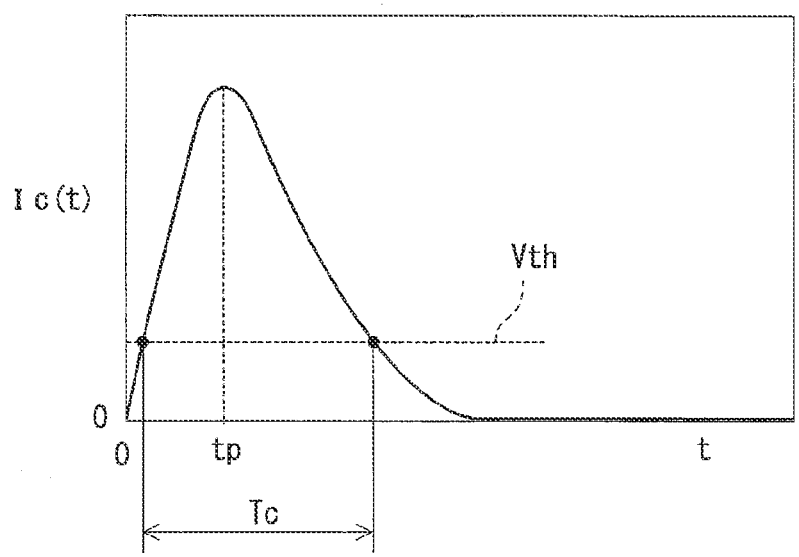
FIG. 5B is a diagram of the theoretical waveform of the capacitor inrush current.

As shown in FIG. 5B, a waveform of the capacitor inrush current Ic(t) is such that when a time t is 0, the capacitor inrush current Ic is 0, when the time t is tp, the capacitor inrush current Ic has a positive extremum, and when the time t is greater than tp, the capacitor inrush current Ic converges to zero.

Figure 6A:
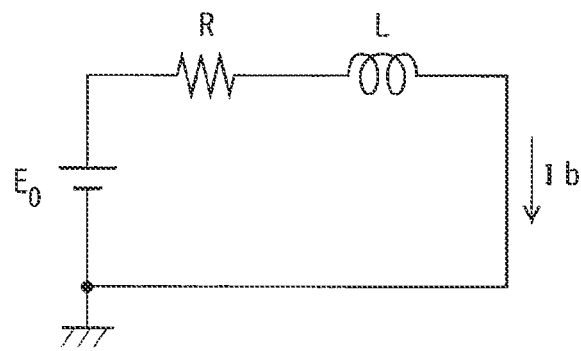
FIG. 6A is a schematic diagram of a circuit model used to obtain a theoretical waveform of a battery short-circuit current.

Next, as shown in FIG. 6A, in a circuit assumed here, a resistor having a resistance R and a coil having an inductance L are connected in series with a battery of a DC voltage E0. Based on the circuit shown in FIG. 6A, a battery short-circuit current Ib(t) is given by the following formula (2):

$$Ib(t) = \frac{E_0}{R}\left(1 - e^{-\frac{R}{L}t}\right) \tag{2}$$

Figure 6B:
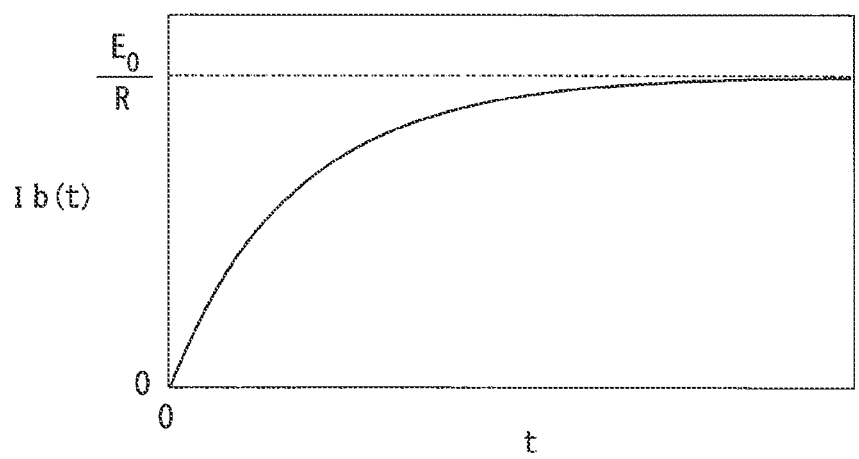
FIG. 6B is a diagram of the theoretical waveform of the battery short-circuit circuit.

As shown in FIG. 6B, the battery short-circuit current Ib(t) has a waveform of a step response of a first-order system.

In practice, a combined waveform of the battery short-circuit current Ib (t) and the capacitor inrush current Ic(t) appears in the inverters 601 and 602.

Because of such a behavior of the power supply current as described above, the following phenomenon occurs in the repetitive monitoring process.

Firstly, it is assumed the temporary abnormal system returns to normal after the power supply relay 551 is turned OFF once. Even when the power supply relay 551 is turned ON again under this condition, the battery short-circuit current Ib does not flow. However, since the input capacitor 581 of the temporary abnormal system has been discharged when the power supply relay 551 was turned ON in the previous cycle, the capacitor inrush current Ic flows from the input capacitor 582 of the normal system when the power supply relay 551 is turned ON again. Due to this capacitor inrush current Ic, the power supply current in the temporary abnormal system is incorrectly detected as excessive. As a result, although the temporary abnormal system returns to normal, it is determined that the short-circuit failure occurs in the temporary abnormal system. Therefore, there is no point in performing the repetitive monitoring process.

Further, in the normal system, the capacitor inrush current Ic is discharged from the input capacitor 582 when the power supply relay 551 of the temporary abnormal system is turned OFF. Then, when the power supply relay 551 of the temporary abnormal system is turned OFF upon detection that the power supply current is excessive, the secondary inrush current Jbc flows from the battery 47 into the input capacitor 582 of the normal system. Due to this secondary inrush current Jbc, the power supply current in the normal system may be incorrectly detected as excessive.

For the reasons described above, in an apparatus with multiple systems, each of which has a drive circuit, unlike an apparatus with one system which has a drive circuit, it is difficult to adequately perform the repetitive monitoring process. According to the first embodiment, a detection error caused by the capacitor inrush current Ic, which flows from the input capacitor 582 of the normal system into the temporary abnormal system when the power supply relay 551 is turned OFF, is prevented as described below.

A repetitive monitoring process performed by the power supply current monitoring device 30 according to the first embodiment of the present disclosure is described below with reference to FIGS. 7, 8, 9, and 10.

FIG. 7 illustrates timing diagrams of a first case where the short-circuit failure occurs in the temporary abnormal system and continues. FIG. 7 shows characteristic values in a first monitoring cycle, in a second monitoring cycle, and in a Nth monitoring cycle of the repetitive monitoring process when a predetermined number of times the repetitive monitoring process is to be performed is set to N, where N is an integer not less than three (i.e., N≥3). Characteristic values in each of third to "N−1" monitoring cycles of the repetitive monitoring process is the same as those in the second monitoring cycle.

(a), (b), (c), (d), (g), and (h) of FIG. 7 show characteristic values related to the temporary abnormal system.

(a) of FIG. 7 corresponds to FIG. 4B and shows the power supply current in the temporary abnormal system. As shown in (a) of FIG. 7, the waveforms of the capacitor inrush current Ic and the battery short-circuit current Ib appear in each monitoring cycle.

(b) of FIG. 7 shows the output signal of the comparator 331. The output signal of the comparator 331 is high during a time period where the power supply current shown in (a) of FIG. 7 remains above the threshold Vth.

(c) of FIG. 7 shows the accumulated time counted by the accumulated time counter 351. The first overcurrent time Tc is accumulated while the capacitor inrush current Ic flows after the start time t1. An overcurrent determination threshold Tj is set to a value greater than the first overcurrent time Tc and smaller than the sum of the first overcurrent time Tc and the second overcurrent time Tb. A margin period Ta is set to a value obtained by subtracting the first overcurrent time Tc from the overcurrent determination threshold Tj. That is, the first overcurrent time Tc, the second overcurrent time Tb, the overcurrent determination threshold Tj, and the margin period Ta have relationships given by the following formulas (3.1), (3.2), and (3.3).

$$Tc < Tj < Tc + Tb \quad (3.1)$$

$$Tc + Ta = Tj \quad (3.2)$$

$$Ta < Tb \quad (3.3)$$

The margin period Ta is a margin to the overcurrent determination threshold Tj at the time the first overcurrent time Tc is accumulated. In other words, the accumulated time counter 351 reaches the overcurrent determination threshold Tj when accumulating the margin period Ta after accumulating the first overcurrent time Tc. The accumulated time counter 351 is reset to an initial value (e.g., zero) when a predetermined monitoring time Tw (e.g., 1 ms) elapses from the start time t1.

(d) of FIG. 7 shows an ON and OFF state of the power supply relay 551 of the temporary abnormal system. The power supply relay 551 is turned OFF when the accumulated time counter 351 reaches the overcurrent determination threshold Tj. Then, the power supply relay 551 is turned ON again when a predetermined cycle time Tx (e.g., 5 ms) elapses from the start time t1 under a condition that the number of times the repetitive monitoring process has been performed is less than the predetermined number N. Thus, a next monitoring cycle starts at a time t0 at which the power supply relay 551 has been turned ON again.

Strictly speaking, the cycle time Tx is a time from a first time t0 at which the power supply relay 551 is turned ON firstly to a second time t0 at which the power supply relay 551 is turned ON again. However, a time from the first time t0 to the start time t1 at which the power supply current exceeds the threshold Vth is very small and negligible. Therefore, for the sake of simplicity, the time from the start time t1 to the second time t0 at which the power supply relay 551 is turned ON again so that the next monitoring cycle can start is hereinafter referred to as the "cycle time Tx".

(g) and (h) of FIG. 7 show diagnosis signals outputted by the power supply current monitoring device 30 to the microcomputer 20. Specifically, (g) of FIG. 7 shows a temporary diagnosis signal outputted when the power supply relay 551 is turned OFF in each monitoring cycle, and (h) of FIG. 7 shows a final diagnosis signal outputted when the temporary diagnosis signal is outputted a predetermined consecutive number N of times. When receiving the temporary diagnosis signal or the final diagnosis signal, the microcomputer 20 performs a predetermined failure handling operation for the temporary abnormal system from a fail-safe standpoint.

(e) and (f) of FIG. 7 show characteristic values related to the normal system.

(e) of FIG. 7 shows a mask time during which a mask procedure to stop monitoring the power supply current in the normal system is performed. According to the first embodiment, the mask time is from when the power supply relay 551 is turned OFF to when the monitoring time Tw elapses in each monitoring cycle. It is noted that the monitoring time Tw is set smaller than the cycle time Tx.

(f) of FIG. 7 corresponds to FIG. 4C and shows the power supply current in the normal system. The monitoring time Tw is set so that a period where the secondary inrush current Jbc appears can be included in the mask time.

Figure 8:
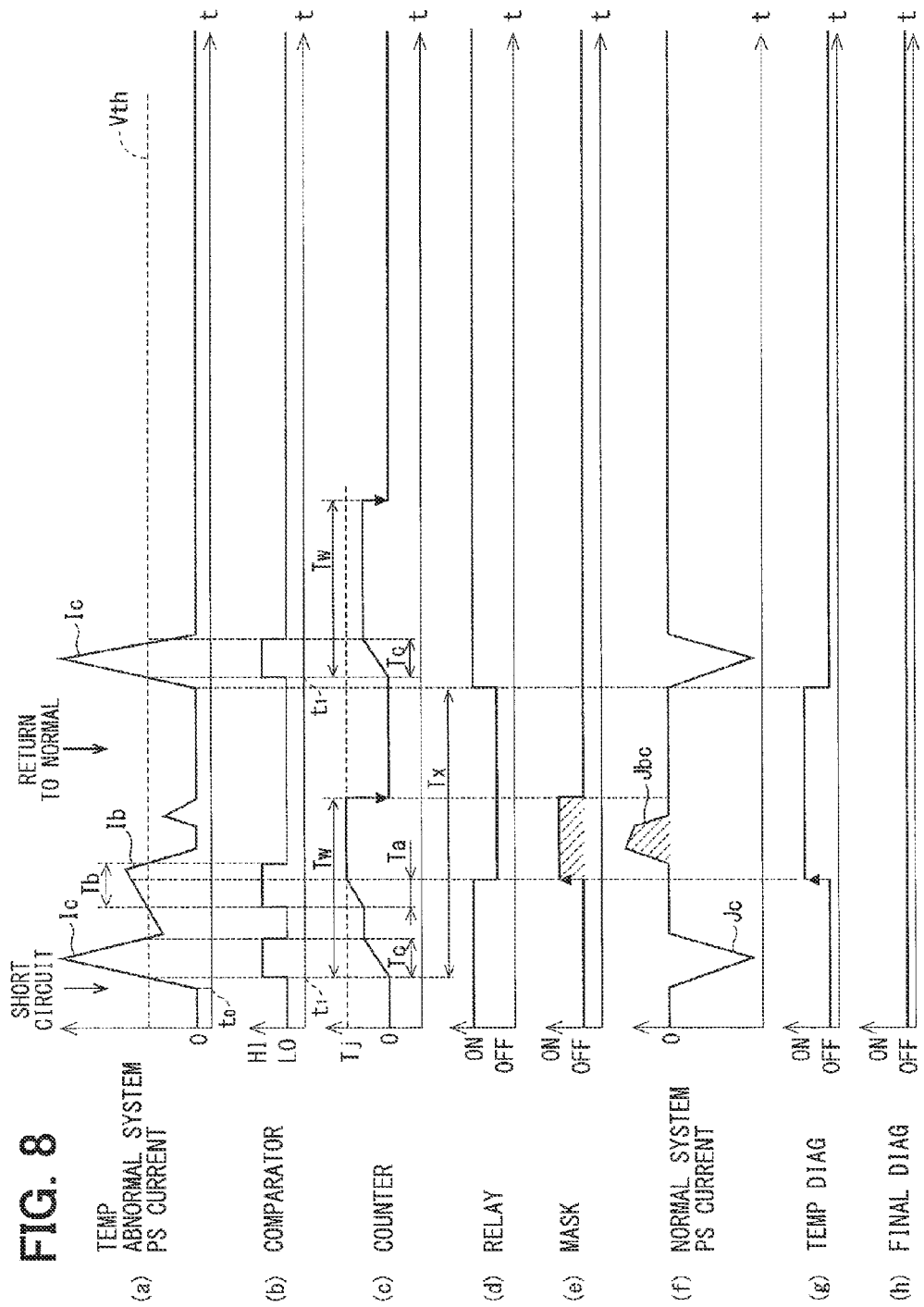
FIG. 8 is a timing diagram of the repetitive monitoring process observed when a short-circuit failure occurred in one system is cured.
Figure 9:
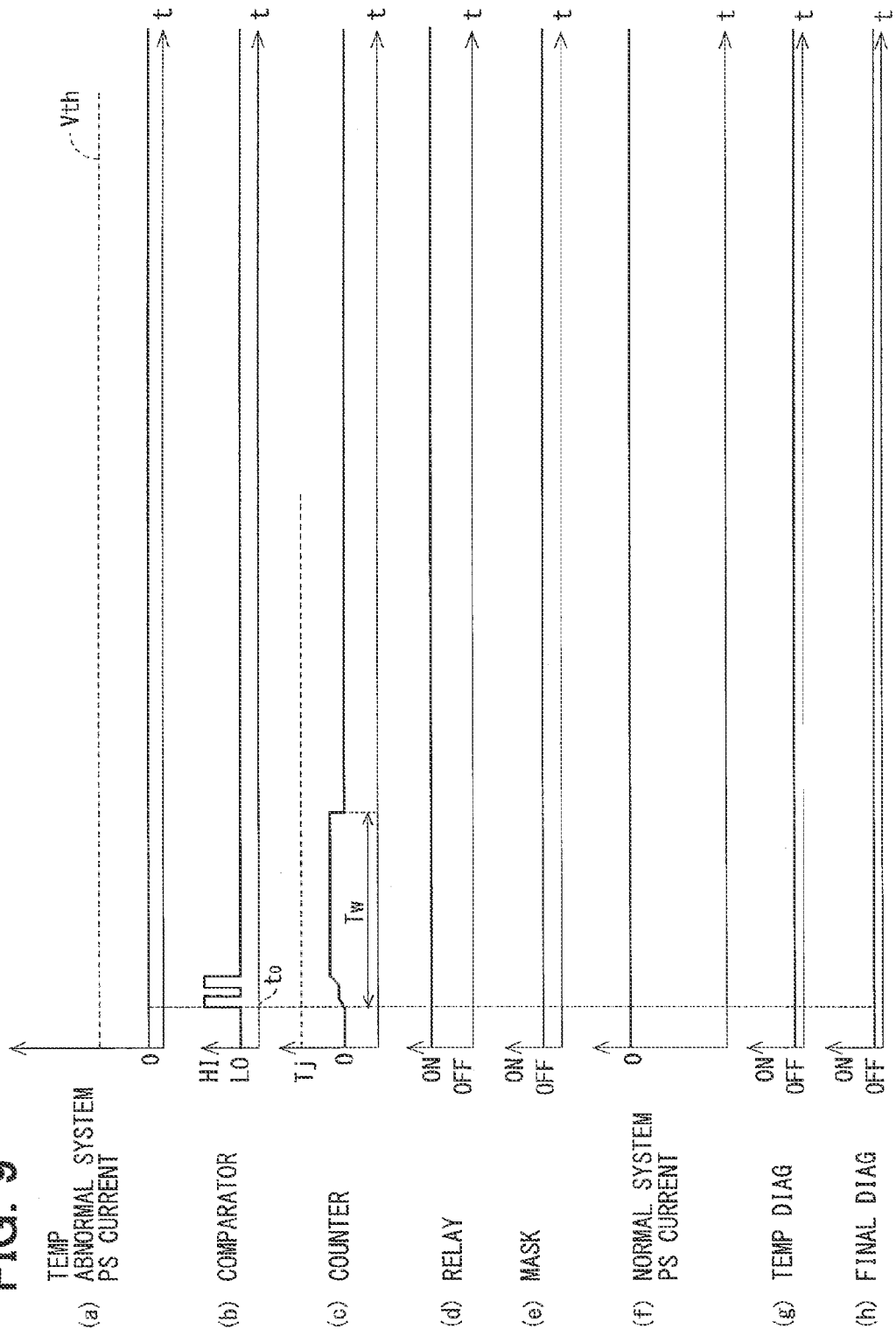
FIG. 9 is a timing diagram of the repetitive monitoring process observed when noise occurs in the power supply current monitoring device.

The above matters for FIG. 7 hold for FIGS. 8 and 9.

In the first monitoring cycle, when the capacitor inrush current Ic and the battery short-circuit current Ib flow in the temporary abnormal system, the accumulated time counter 351 reaches the overcurrent determination threshold Tj by accumulating the first overcurrent time Tc and the margin time Ta. Then, the power supply relay 551 is turned OFF, the temporary diagnosis signal is outputted, and the mask procedure is started.

Then, when the monitoring time Tw elapses after the start time t1, the accumulated time counter 351 is reset, and the mask procedure is finished. Then, when the cycle time Tx elapses from the start time t1, the power supply relay 551 is turned OFF again so that the second monitoring cycle can be started.

If the short-circuit failure continues, the same behavior as in the first monitoring cycle is repeated in each of the second to "N−1"th monitoring cycles. Then, when the power supply relay 551 is turned OFF in the Nth monitoring cycle, i.e., when the power supply relay 551 is turned OFF for the Nth time in total, the final diagnosis signal is transmitted to the microcomputer 20 in addition to the Nth temporary diagnosis signal. Thus, it is finally determined that the short-circuit failure occurs in the temporary abnormal system.

FIG. 8 illustrates timing diagrams of a second case where the short-circuit failure temporarily occurs in the temporary abnormal system and then the temporary abnormal system returns to normal. The first monitoring cycle, which is performed for the first time after the short-circuit failure occurs in the temporary abnormal system, is the same between the first case shown in FIG. 7 and the second case shown in FIG. 8.

However, as shown in (a) of FIG. 8, when the temporary abnormal system returns to normal after the monitoring time Tw elapses for the first time, although the capacitor inrush current Ic flows in the temporary abnormal system in the second monitoring cycle, the battery short-circuit current Ib does not flow.

Accordingly, the accumulated time counter 351 accumulates only the first overcurrent time Tc. Therefore, as shown in (c) of FIG. 8, before the accumulated time counter 351 reaches the overcurrent determination threshold Tj, the monitoring time Tw elapses so that the accumulated time counter 351 is reset. Therefore, the power supply relay 551 which is turned ON in the second monitoring cycle remains ON. Thus, the repetitive monitoring process for the temporary abnormal system is automatically ended when the monitoring time Tw elapses. In the normal system, the secondary inrush current Jbc from the battery 47 does not occur because the power supply relay 551 remains ON.

FIG. 9 illustrates timing diagrams of a third case where the short-circuit failure actually occurs in neither system, but noise or disturbance enters any of the systems. Here, it is assumed that the noise is detected in the first system. For the sake of convenience, although the first system in which the noise is detected is hereinafter referred to as the "temporary abnormal system".

As shown in (a) and (f) of FIG. 9, a short-circuit current actually occurs in neither system. However, as shown in (b) of FIG. 9, a pulse noise of a few μs appears in the output signal of the comparator 331. In this case, as shown in (c) of FIG. 9, the accumulated time counter 351 starts to accumulate the time in response to a first pulse of the noise. However, since the width of the pulse is very small, the time accumulated by the accumulated time counter 351 becomes very small. Therefore, before the accumulated time counter 351 reaches the overcurrent determination threshold Tj, the monitoring time Tw elapses so that the accumulated time counter 351 is reset.

In this way, it is possible to adequately prevent the noise from causing the detection error.

Figure 10:
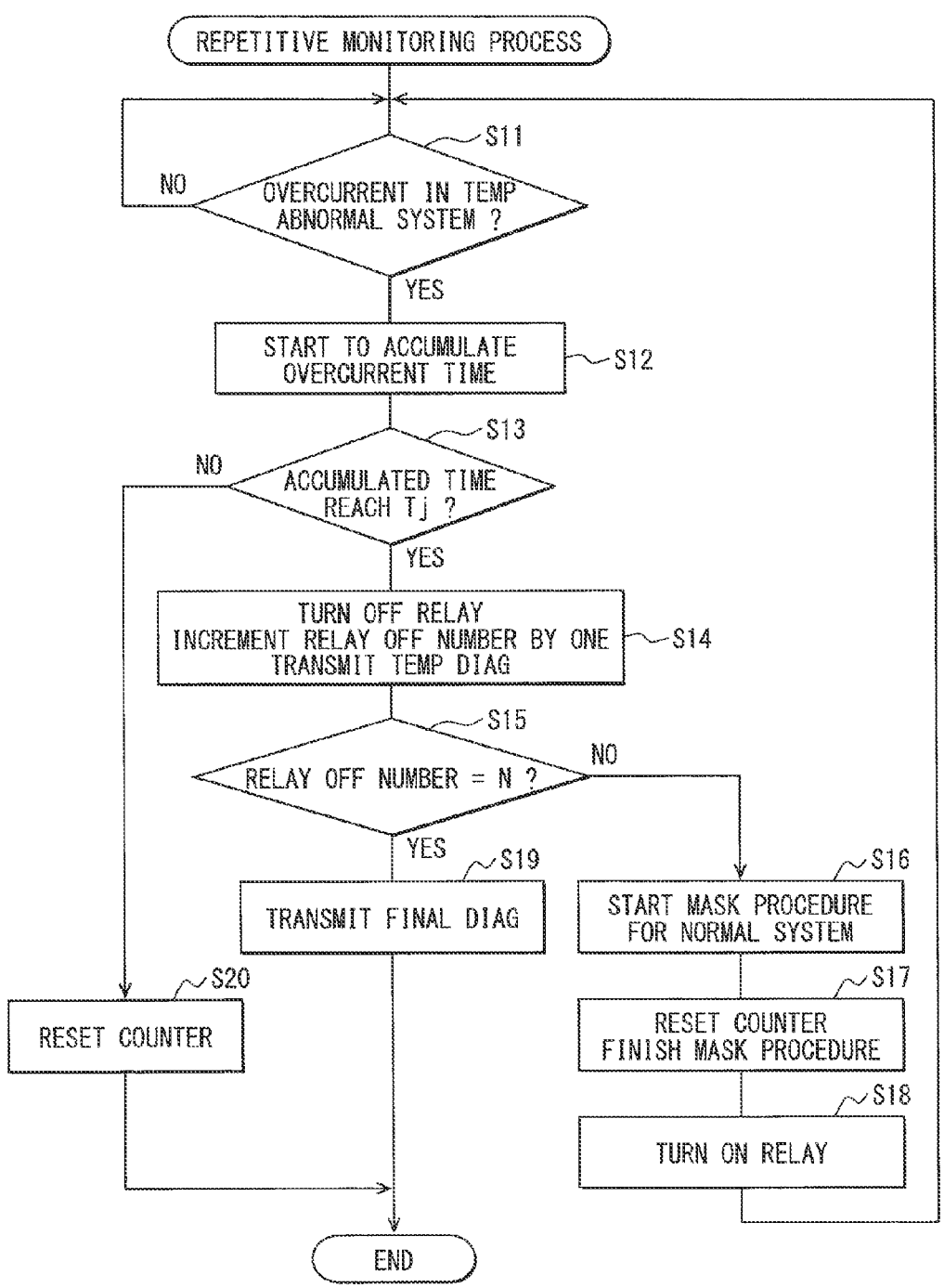
FIG. 10 is a flowchart of the repetitive monitoring process.

FIG. 10 is a flowchart of the repetitive monitoring process corresponding to the timing diagrams shown in FIGS. 7 and 8.

The repetitive monitoring process starts at S11 where it is determined whether the power supply current in the temporary abnormal system is excessive. It is noted that at S11 of the first monitoring cycle of the repetitive monitoring process, it is determined whether the power supply current in any system is excessive, and the system in which the excessive power supply current flows is regarded as the "temporary abnormal system". Then, when the repetitive monitoring process returns to S11 from S18 so that the next monitoring cycle can start, it is determined at S11 whether the power supply current in the temporary abnormal system remains excessive.

If the power supply current in the temporary abnormal system is excessive corresponding to YES at S11, the repetitive monitoring process proceeds to S12 where the overcurrent time starts to be accumulated from the start time t1 at which the power supply current exceeds the threshold Vth. If the short-circuit failure continues after that, the capacitor inrush current Ic and the battery short-circuit current Ib flows in the temporary abnormal system (see, FIG. 7). In contrast, if the temporary abnormal system returns to normal after that, the capacitor inrush current Ic flows, but the battery short-circuit current Ib does not flow (see, FIG. 8).

Then, the repetitive monitoring process proceeds to S13 where it is determined whether the accumulated time reaches the overcurrent determination threshold Tj. If the first overcurrent time Tc caused by the capacitor inrush current Ic and the margin time Ta out of the second overcurrent time Tb caused by the battery short-circuit current Ib are accumulated so that the accumulated time can reach the overcurrent determination threshold Tj, it is determined that the accumulated time reaches the overcurrent determination threshold Tj corresponding to YES at S13, and the repetitive monitoring process proceeds to S14. At S14, the power supply relay 551 is turned OFF, and a relay OFF number, which is the number of times the power supply relay 551 is turned OFF, is incremented by one. Further, at S14, the power supply current monitoring device 30 transmits the temporary diagnosis signal to the microcomputer 20 (see, FIG. 7).

In contrast, if the first overcurrent time Tc and the margin time Ta are not accumulated so that the accumulated time cannot reach the overcurrent determination threshold Tj before the monitoring time Tw elapses from the start time t1, it is not determined that the accumulated time reaches the overcurrent determination threshold Tj corresponding to NO at S13, and the repetitive monitoring process proceeds to S20. At S20, the accumulated time counter is reset, and the repetitive monitoring process is ended (see, FIG. 8).

At S15 subsequent to S14, it is determined whether the relay OFF number reaches the predetermined number N, which is the number of times the repetitive monitoring process is to be performed. If the relay OFF number does not reach the number N corresponding to NO at S15, the repetitive monitoring process proceeds to S16 where the mask procedure for the normal system is started at the same time when the power supply relay is turned OFF. Then, the repetitive monitoring process proceeds to S17 where the accumulated time counter is reset and the making procedure is finished when the monitoring time Tw elapses from the start time t1. Then, the repetitive monitoring process proceeds to S18 where the power supply relay is turned ON when the cycle time Tx elapses from the start time t1. After S11, the repetitive monitoring process returns to S11 so that the next monitoring process can be started (see, FIG. 7).

In contrast, if the relay OFF number reaches the number N corresponding to YES at S15, the repetitive monitoring process proceeds to S19 where it is finally determined that the short-circuit failure occurs in the temporary abnormal system, and the power supply current monitoring device 30 transmits the final diagnosis signal to the microcomputer 20. After S19, the repetitive monitoring process is ended.

In summary, the power supply current monitoring device 30 according to the first embodiment of the present disclosure can have the following advantages (I)-(IV).

(I) In the repetitive monitoring process for the temporary abnormal system, the power supply current monitoring device 30 does not finally determine that the short-circuit failure occurs in the temporary abnormal system until the monitoring cycle, in which the accumulated time of the overcurrent time reaches the determination threshold Tj, is repeated the predetermined consecutive number N of times after the power supply relay 551 is turned ON. The overcurrent determination threshold Tj is greater than the first overcurrent time Tc caused by the capacitor inrush current Ic and smaller than the sum of the first overcurrent time Tc and the second overcurrent time Tb caused by the battery short-circuit current Ib. In such an approach, whether or not the short-circuit failure occurs can be determined based on whether or not the battery short-circuit current Ib flows without consideration of the capacitor inrush current Ic.

(II) Further, in the repetitive monitoring process for the temporary abnormal system, the power supply current monitoring device 30 performs the mask procedure to stop monitoring the power supply current in the normal system. The mask procedure is performed at least for a predetermined time period after the power supply relay of the temporary abnormal system is turned OFF in each monitoring cycle. In such an approach, it is possible to prevent the power supply current in the normal system from being incorrectly determined as excessive due to the secondary inrush current Jbc.

(III) Further, in each monitoring cycle of the repetitive monitoring process, when the accumulated time of the overcurrent time reaches the determination threshold Tj after the power supply relay 551 is turned ON, the mask procedure is started at the same time when the power supply relay 551 is turned OFF. Then, the mask procedure is finished when the monitoring time Tw elapses from the start time t1. In this way, since a time period during which the mask procedure is performed is minimized, a risk of failing to detect the short-circuit failure occurring in the normal system during the mask procedure can be minimized.

(IV) The power supply current monitoring device 30 according to the first embodiment is used in the motor drive apparatus 10 for an electric power steering system for a vehicle. In general, to increase reliability of an electric power steering system, it is preferable that a motor drive apparatus for an electric power steering system should have two systems, each of which a drive circuit, configured in a redundant manner. Therefore, the power supply current monitoring device 30 can effectively exert its effects, in particular, when used in the motor drive apparatus 10.

Second Embodiment

A repetitive monitoring process performed by a power supply current monitoring device 30 according to a second embodiment of the present disclosure is described below with reference to FIG. 11. FIG. 11 corresponds to FIG. 7 and is illustrated with the same symbols as used in FIG. 7.

As shown in (e) of FIG. 11, according to the second embodiment, the mask procedure for the normal system is continuously performed from the start time t1, at which the power supply current exceeds the threshold Vth for the first time, to the end of the monitoring time Tw in the last (i.e., Nth) monitoring cycle of the repetitive monitoring process. That is, the mask procedure is continuously performed without being stopped in each monitoring cycle. Thus, a mask period, where the mask procedure is performed, of the second embodiment includes the entire mask period of the first embodiment.

When a period from the time t0, at which the power supply relay is turned ON, to the start time t1 in each monitoring cycle is ignored, a mask period of the second embodiment can be given as follows: Pm≈Tx×(N−1)+Tw. Procedures except the mask procedure are performed in the same manner as in the first embodiment. For example, whether or not the short-circuit failure occurs in the temporary abnormal system is determined based on the accumulated time.

As described above, according to the second embodiment, the mask procedure is started at the start time t1 at which the power supply current exceeds the threshold Vth for the first time. Alternatively, like in the first embodiment, the mask procedure can be started when the power supply relay is turned OFF in the first monitoring cycle.

The advantages (I), (II), and (IV) of the first embodiment can be obtained in the second embodiment.

(Modification)

While the present disclosure has been described with reference to the embodiment, it is to be understood that the disclosure is not limited to the embodiment. The present disclosure is intended to cover various modifications and equivalent arrangements within the spirit and scope of the present disclosure.

The current detector which produces a voltage based on which the power supply current is detected is not limited to the shunt resistors 571 and 572 but includes other elements having predetermined resistances. As described in JP-A-2013-183462, for example, to prevent currents from flowing to the inverters 601 and 602 through parasitic diodes of the power supply relays 551 and 552 when the battery 47 is connected in reverse polarity, additional power supply relays having parasitic diodes opposite in direction to those of the power supply relays 551 and 552 can be connected in series. In this configuration, the additional power supply relay can be used as the current detector.

In the embodiments, the power supply current monitoring device according to the present disclosure is applied to two inverters 601 and 602 which are configured to work in cooperation with each other to drive a three-phase brushless AC motor. Alternatively, the power supply current monitoring device according to the present disclosure can be applied to two H-bridge circuits which are configured to work in cooperation with each other to drive a DC motor. These motors are not limited to a steering assist motor of an electric power steering system. Further, the power supply current monitoring device according to the present disclosure can be applied to any types of drive circuits which are configured to work in cooperation with each other to drive an electrical load besides a motor, as long as an input stage of each drive circuit is provided with a capacitor.

Further, the power supply current monitoring device according to the present disclosure can be applied to a load drive apparatus where three or more systems, each of which has a drive circuit connected in parallel to a power supply. In this case, the present disclosure can be applied by considering one of the systems as the temporary abnormal system and the others of the systems as the normal system. In each normal system, the capacitor discharge current Jc having a negative value occurs when the power supply relay of the temporary abnormal system is turned ON. A detection error caused by the capacitor inrush current Ic from each normal system can be prevented in the same manner as disclosed in the embodiments.

Such changes and modifications are to be understood as being within the scope of the present disclosure as defined by the appended claims.

What is claimed is:

1. A power supply current monitoring apparatus for a load drive apparatus, the load drive apparatus including a battery and two systems configured to work in cooperation with each other to drive a load, each system including a drive circuit connected in parallel with the battery, an input capacitor arranged at an input unit of the drive circuit on a battery side, and a power supply relay connected between the drive circuit and a power branching point, at which power of the battery is divided between the systems, to open and close a power supply path from the battery to the drive circuit, the power supply current monitoring apparatus configured to monitor a magnitude of a power supply current flowing through the power supply relay toward the drive circuit in each system, the power supply current monitoring apparatus comprising:
- a circuit configured to determine whether a short-circuit failure occurs based on a voltage across a current detector through which the power supply currents flows, the short-circuit failure defined as a failure occurring when a high potential side and a low potential side of the drive circuit is short-circuited, and
- a power supply relay controller that opens and closes the power supply relay, wherein
- when the circuit detects the power supply current exceeding a predetermined first threshold once in one of the systems, a repetitive monitoring process is performed, the one of the systems being defined as a temporary abnormal system having a possibility that the short-circuit failure occurs therein, and the other of the systems being defined as a normal system having no possibility that the short-circuit failure occurs therein, the repetitive monitoring process determines that the short-circuit failure actually occurs in the temporary abnormal system when a predetermined condition is satisfied by repeating a monitoring cycle a predetermined number of times,
- the monitoring cycle turns OFF the power supply relay of the temporary abnormal system and then monitors the magnitude of the power supply current when a predetermined cycle time elapses from a start time by turning ON the power supply relay of the temporary abnormal system, the start time being a time at which the power supply current exceeds the first threshold,
- in the repetitive monitoring process, the power supply current to be monitored in the monitoring cycle when the power supply relay of the temporary abnormal system is turned ON includes a capacitor inrush current and a battery short-circuit current,
- the capacitor inrush current is a current flowing from the input capacitor of the normal system into the temporary abnormal system,
- the battery short-circuit current is a current flowing from the battery into the temporary abnormal system when the short-circuit failure continues in the temporary abnormal system,
- the repetitive monitoring process includes a mask procedure to stop monitoring the magnitude of the power supply current in the normal system,
- the mask procedure is performed at least for a predetermined time period after the power supply relay of the temporary abnormal system is turned OFF in each the monitoring cycle,
- the two systems are arranged separately from each other, and
- in the repetitive monitoring process, the power supply relay of the temporary abnormal system turns on and off, and the power supply relay of the normal system continues to turn on.

2. The power supply current monitoring apparatus according to claim 1, wherein
- the monitoring cycle accumulates an overcurrent time during which the power supply current remains above the first threshold after the power supply relay is turned ON,
- when the overcurrent time reaches a predetermined second threshold, the power supply relay is turned OFF and simultaneously the mask procedure is started,
- the mask procedure is finished when a predetermined monitoring time elapses from the start time, and
- the monitoring time is smaller than the cycle time.

3. The power supply current monitoring device according to claim 1, wherein
- the drive circuit, the input capacitance, the power supply relay, and the current detector of one system are identical in specification and electric performance with the drive circuit, the input capacitance, the power supply relay, and the current detector of the other system.

4. The power supply current monitoring device according to claim 1, wherein
- the drive circuit for driving the load in each system is an inverter configured to drive an AC motor or an H-bridge circuit configured to drive a DC motor.

5. The power supply current monitoring device according to claim 4, wherein
- the AC motor or the DC motor is included in an electric power steering system of a vehicle and outputs steering assist torque that augments a driver's steering effort of a steering wheel of the vehicle.

* * * * *